United States Patent
Moehle et al.

(10) Patent No.: US 6,238,845 B1
(45) Date of Patent: *May 29, 2001

(54) METHOD OF FORMING LEAD FRAMES WITH PREFORMATION SUPPORT

(75) Inventors: Paul R. Moehle, Seekonk; Harold T. Kelleher, Attleboro, both of MA (US); Gijsbert Willem Lokhorst, Enter (NL)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/191,973

(22) Filed: Nov. 13, 1998

Related U.S. Application Data

(60) Provisional application No. 60/065,338, filed on Nov. 13, 1997, now abandoned.

(51) Int. Cl.[7] ............................................. G03C 5/00
(52) U.S. Cl. ......................... 430/314; 430/316; 430/318
(58) Field of Search ................................. 430/311, 313, 430/314, 318, 323, 324, 316; 216/41, 13, 14; 427/96

(56) References Cited

U.S. PATENT DOCUMENTS

| | | | |
|---|---|---|---|
| 4,806,106 | * 2/1989 | Mebane et al. | 439/77 |
| 5,403,466 | * 4/1995 | West et al. | 430/313 |
| 5,444,286 | 8/1995 | Ichihashi | 257/420 |
| 5,448,106 | 9/1995 | Fujitsu | 257/688 |
| 5,454,905 | 10/1995 | Fogelson | 156/651.1 |
| 5,471,310 | 11/1995 | Spigarelli et al. | 356/399 |
| 5,536,909 | 7/1996 | DiStefano | 174/261 |
| 5,580,826 | 12/1996 | Matsubara et al. | 437/195 |
| 5,683,943 | * 11/1997 | Yamada | 437/220 |
| 5,945,259 | * 8/1999 | Kim | 430/316 |

* cited by examiner

*Primary Examiner*—Mark F. Huff
*Assistant Examiner*—Saleha R. Mohamedulla
(74) *Attorney, Agent, or Firm*—Dwight N. Holmbo; Wade James Brady III; Frederick J. Telecky Jr.

(57) ABSTRACT

The invention is a method for making a lead frame (30) having fine pitched lead frame leads (32). A first side of the lead frame material is etched to for the lead frame and define the lead frame leads and die pad, but the etch process does not etch completely through the lead frame material. The partially etched first side is then covered with a tape (31) or layer of photoresist (71). The second side of the lead fame material is then etched to complete the lead frame. The lead frame may then be plated.

8 Claims, 11 Drawing Sheets

METHOD OF FORMING LEAD FRAMES WITH PREFORMATION SUPPORT

This application claims priority under 35 USC § 119(e)(1) of provisional application No. 60/065,338 filed Nov. 13, 1997.

FIELD OF THE INVENTION

The invention relates to lead frames used with semiconductor devices, and more particularly to a method of forming lead frames, with fine pitched leads, that utilizes a two step etching and support of the lead frame during the second etching step.

BACKGROUND OF THE INVENTION

Semiconductor devices are being developed to including an increasing number of components which also increases the required number of input/output leads. This increase in input/output leads has required the development of finer pitch lead tips on the lead frame.

The prior art process of making lead frames by etching utilizes a solid metal strip that is laminated on both sides with a photoresist material. Both sides of the photoresist material is exposed to a light though a pattern that defines the lead frame configuration. The photoresist is then developed to remove photoresist in areas that are to be etched to remove the unwanted metal from the metal strip.

The laminated metal strip with the patterned photoresist is then etched to define the metal lead frame. After the etch process, the leads of the lead frame are defined and are separate from one another. The etched leads are subject to damage during the remaining lead frame formation process.

After etching, the photoresist is striped or removed from the lead frame. The lead frame is then plated. Wire bond contact areas may be electroplated.

After plating, the leads of the lead frame are taped to hold them in their respective positions. The lead frames, which generally are formed in continuous strips, are then cut to length, having one or more lead frames on a stip.

The problems that exist with fine pitch leads on the lead frame has been addressed in U.S. Pat. No. 5,454,905, where the leads of the lead frame have two different thicknesses. The outer portion of the lead frame lead has a thickness greater than the inner portion adjacent to the semiconductor die. The inner portions of the lead frame leads have been etched to a less thickness than the outer portions of the lead frame leads.

SUMMARY OF THE INVENTION

The invention is a method for making a lead frame having fine pitched lead frame leads. A first side of the lead frame material is etched to form the lead frame and define the lead frame leads and die pad, but the etch process does not etch completely through the lead frame material. The partially etched first side is then covered with a tape. The second side of the lead fame material is then etched to complete the lead frame. The lead frame may then be plated.

In a second embodiment, the etched first side is covered with a photoresist layer, and the second is covered with photoresist and then etched to form the lead frame.

DESCRIPTION OF A PREFERRED EMBODIMENT

Figure 1:
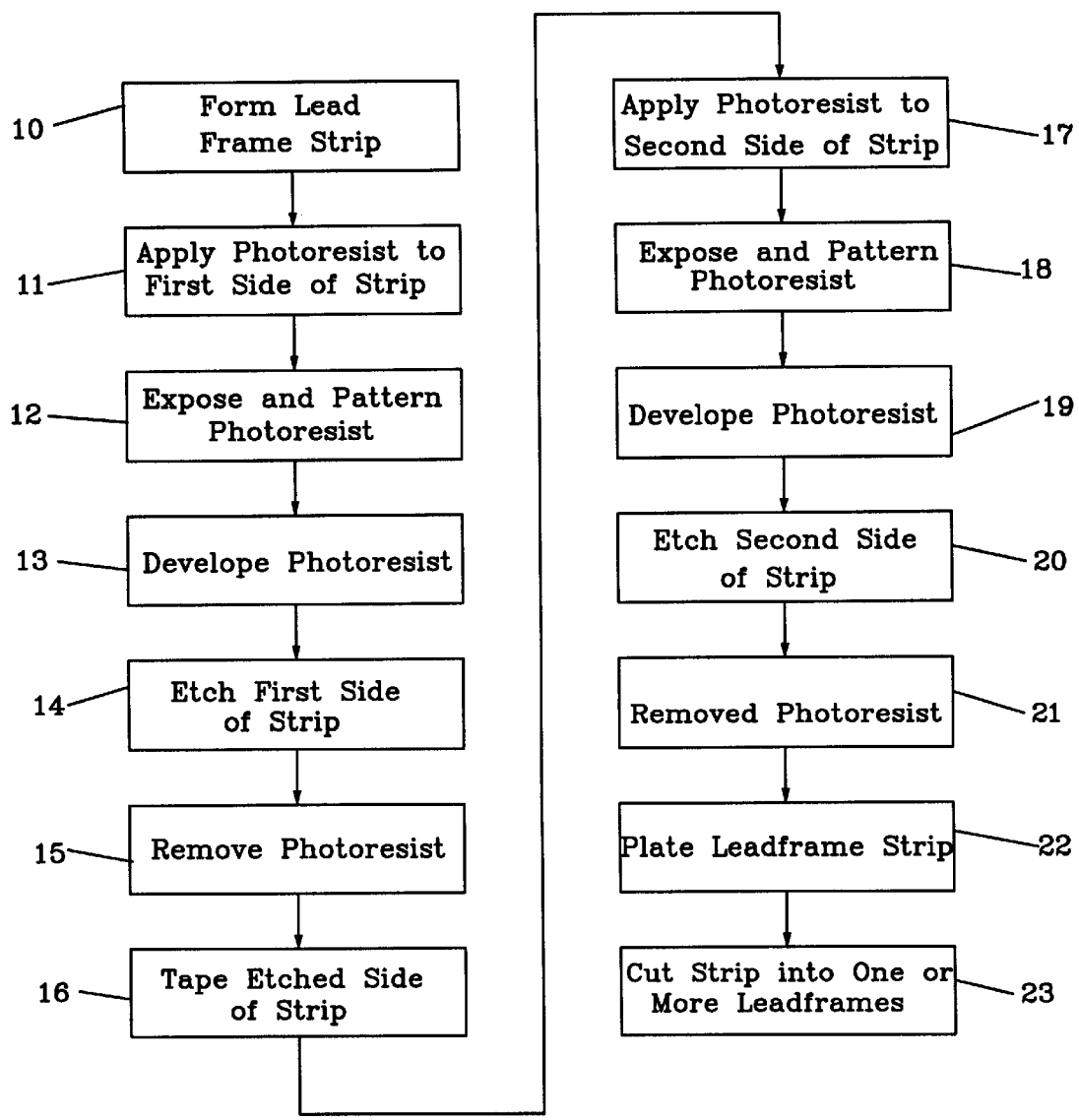
FIG. 1 is a process flow diagram of a first embodiment of the invention.
Figure 2:
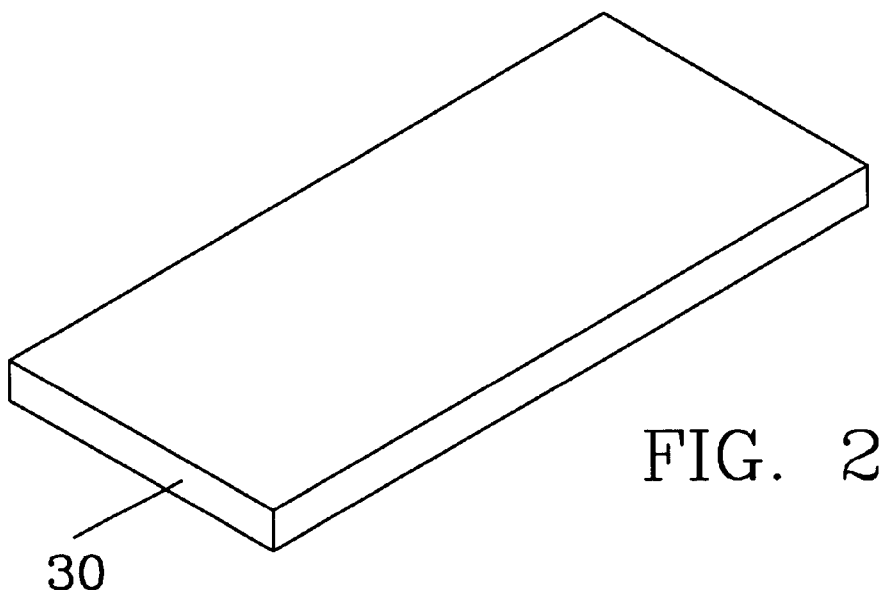
FIG. 2 shows the starting lead frame material.
Figure 3:
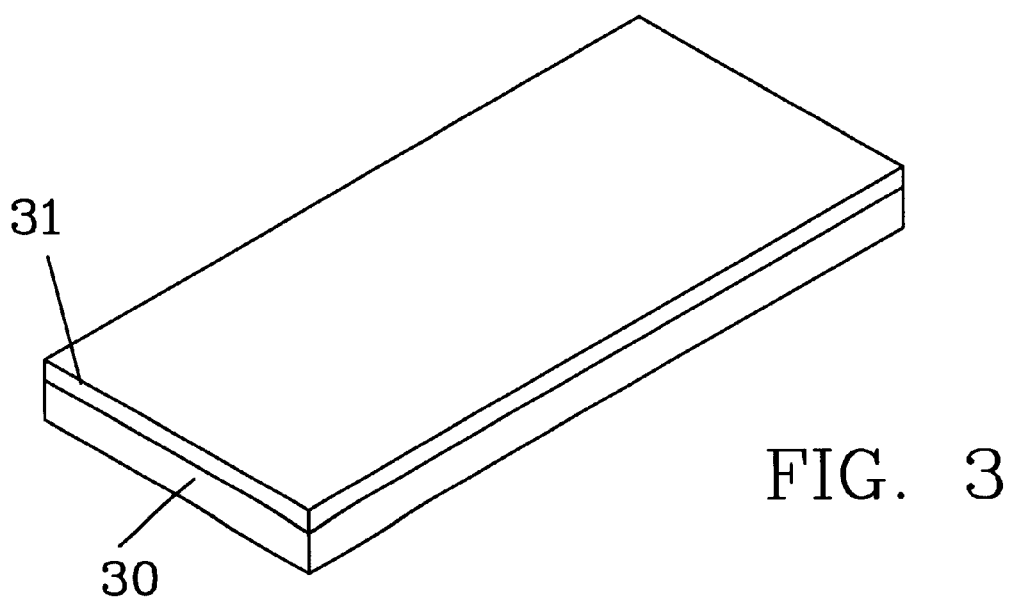
FIG. 3 shows the starting material with photoresist on one side.

FIG. 1 is a process flow diagram of a first embodiment of the invention in which a semiconductor lead frame is formed with fine pitched leads, and maintaining the leads in a stable condition through out the entire process of making the lead frame. A suitable thin strip of material for making the lead frame is prepare (10). The thin strip is shown in FIG. 2. Lead frames are usually made in continuous strips, but in FIG. 2 a strip 30 is illustrated for a single lead frame. Next a coating 31 of photoresist material is applied to a first side of the lead frame material 30 (11). The lead frame material 30 and photoresist coating 31 is shown in FIG. 3.

The photoresist coating 31 is then exposed to a light through a mask to form the lead frame pattern (12). The photoresist coating is then developed (13)to remove the photoresist from areas of the lead frame material 30 that is to be etched in forming the lead frame. The expose areas are etched (14) to etch partially through the lead frame material 30.

Figure 4:
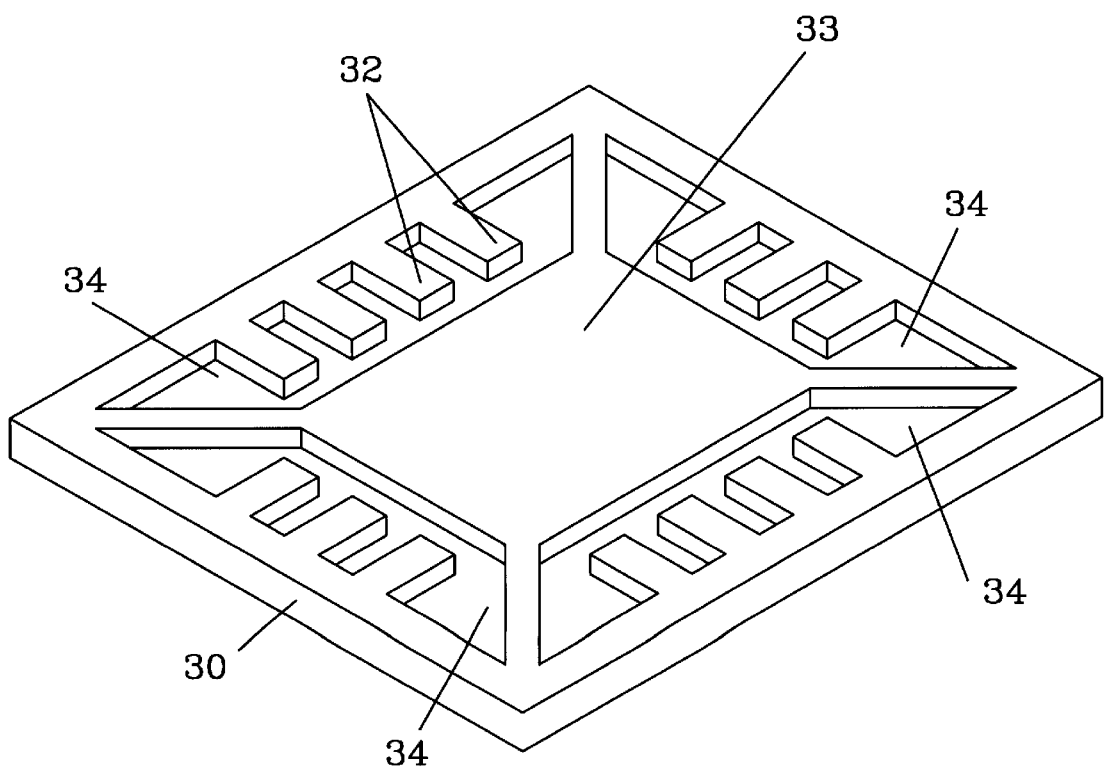
FIG. 4 shows a partially etched through lead frame material.

FIG. 4 shows the lead frame material 30 etch partially though forming leads 32 and semiconductor die pad 33. The etched areas are indicated at 34. As illustrated, lead frame material 30 has been etch approximately half way though, but the depth is not critical since there will be additional etching to remove the remaining lead frame material 30 from the areas 34.

Figure 5:
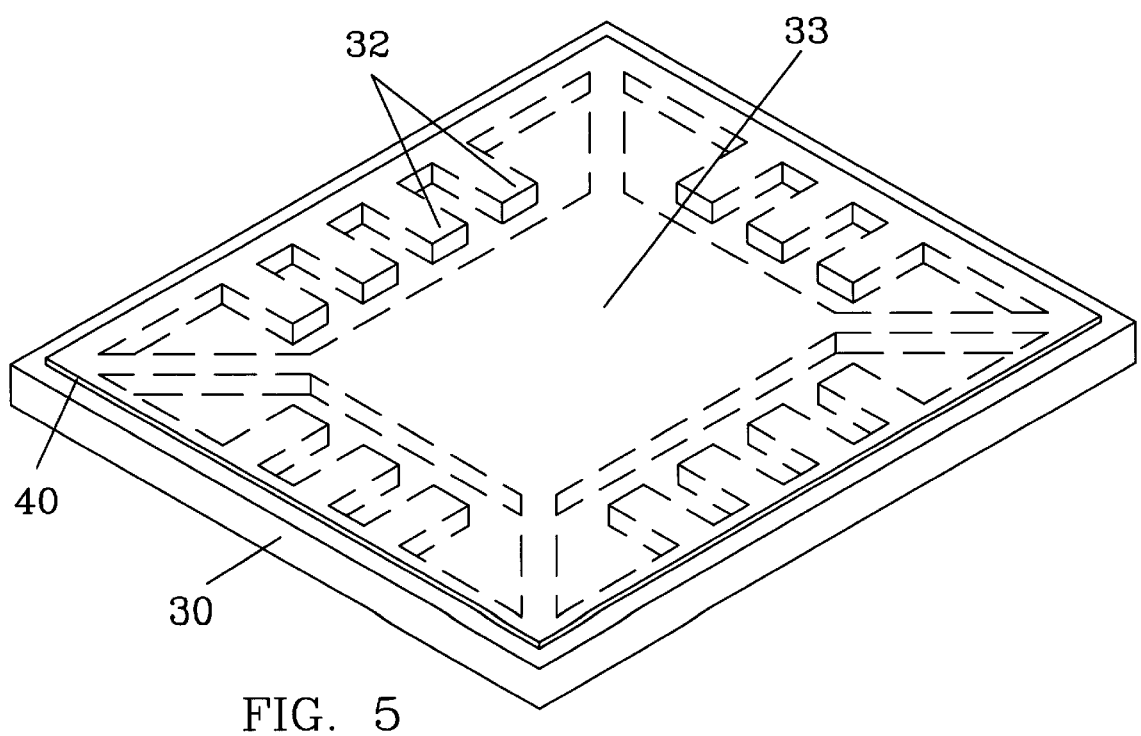
FIG. 5 shows the partially etched lead frame with a coating on the etched side.
Figure 5A:
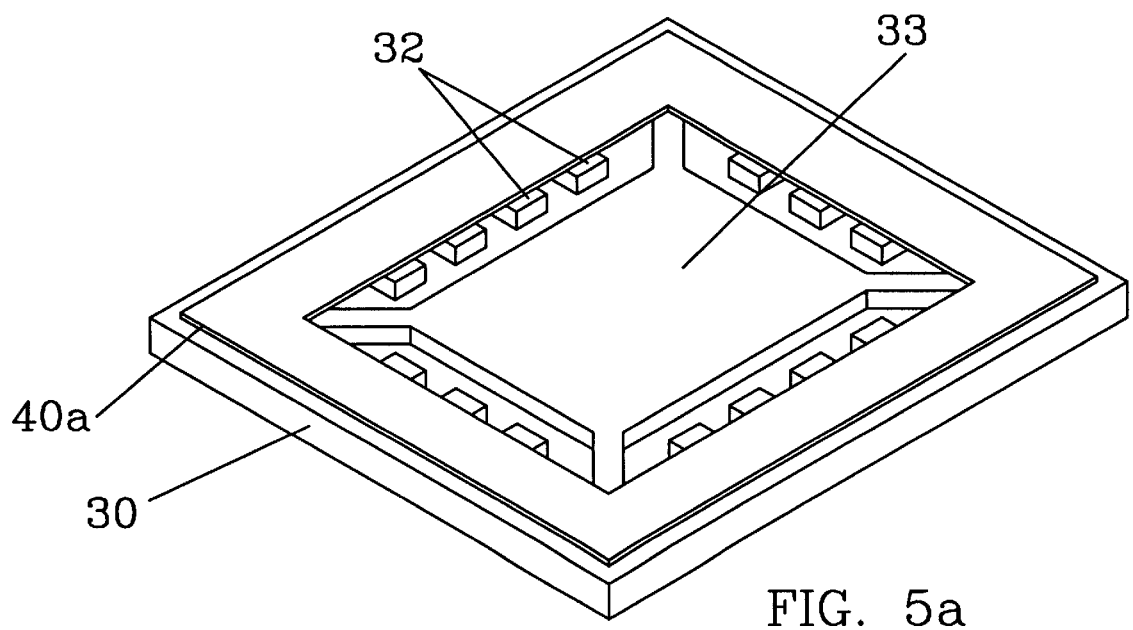
Figure 6:
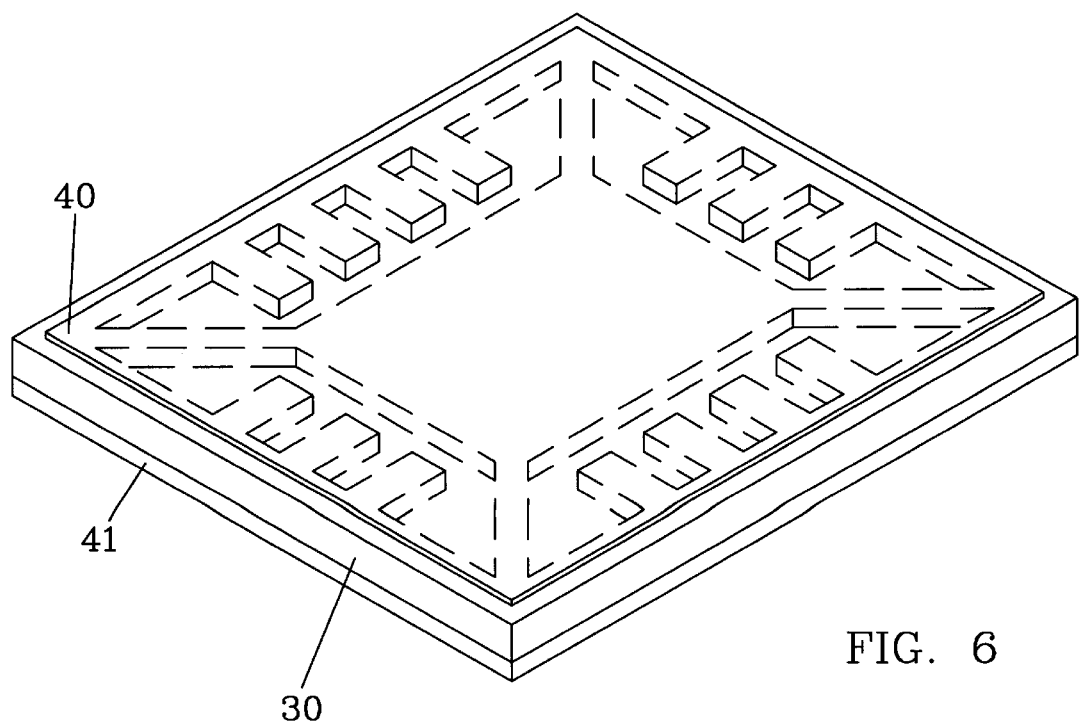
FIG. 6 shows a photoresist layer on the other side of the material.

The remaining photoresist 31 is removed (15) from lead frame strip 30. A coating 40, for example a removable tape such as Kapton, is then applied (16) over the partially etched side of lead frame material 30. Tape 40 is shown applied over the partially etched side in FIG. 5. Another embodiment of a coating 40a, suitable for application over the partially etched side of lead frame material 30, is depicted in FIG. 5a. The leads 32 of the lead frame material 30 can be seen to be secured in their respective positions via the coating 40a while leaving the semiconductor die pad 33 exposed.

Figure 7:
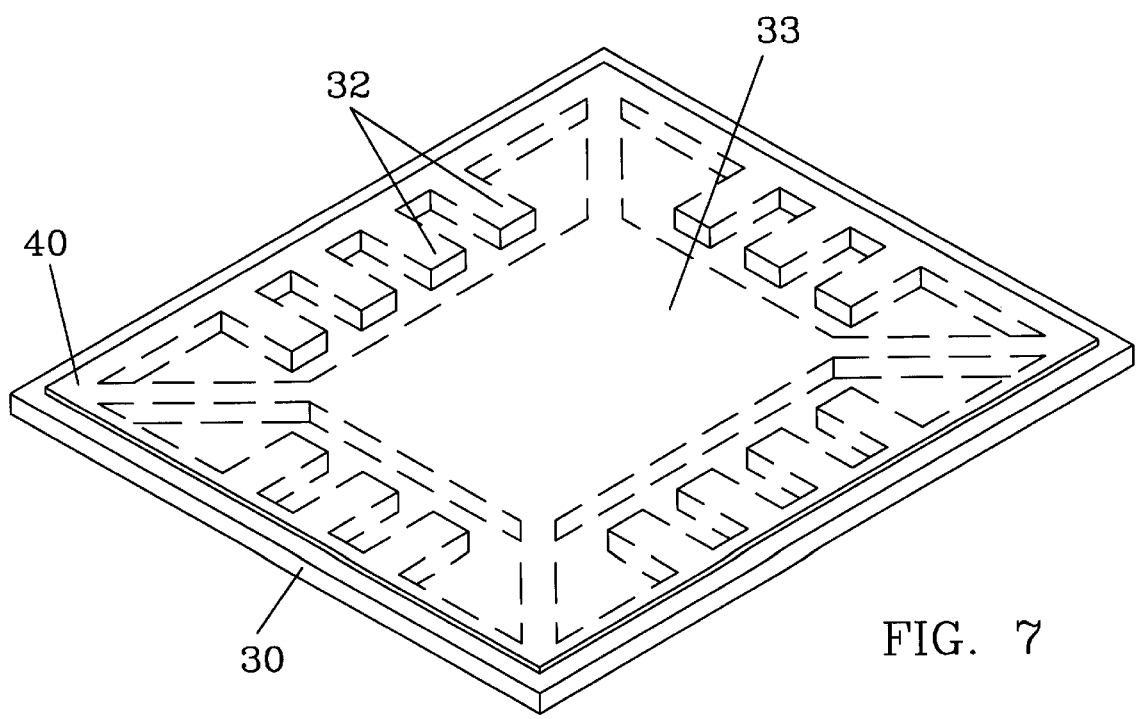
FIG. 7 shows the completed lead frame with the coating on one side.

Next a coating of photoresist 41 is applied to the side of the lead frame material 30, opposite the etched taped side (17). Photoresist 41 is then exposed and patterned (18). The photoresist 41 is then developed (19) to removed the photoresist from the areas of lead frame material 30 that are to be etched (20) away to compete the formation of the lead frame. The remaining photoresist 41 is then removed (21) from the lead frame 30. FIG. 7 shows lead frame 30 with only the tape 40 on one side.

The next step (22) in the process is to plate one side of lead frame 30. The entire side may be plated, or the side may be spot plated to plate only those areas to which a bond wire (not illustrated) is to be attached to the lead frame leads 32.

Figure 8:
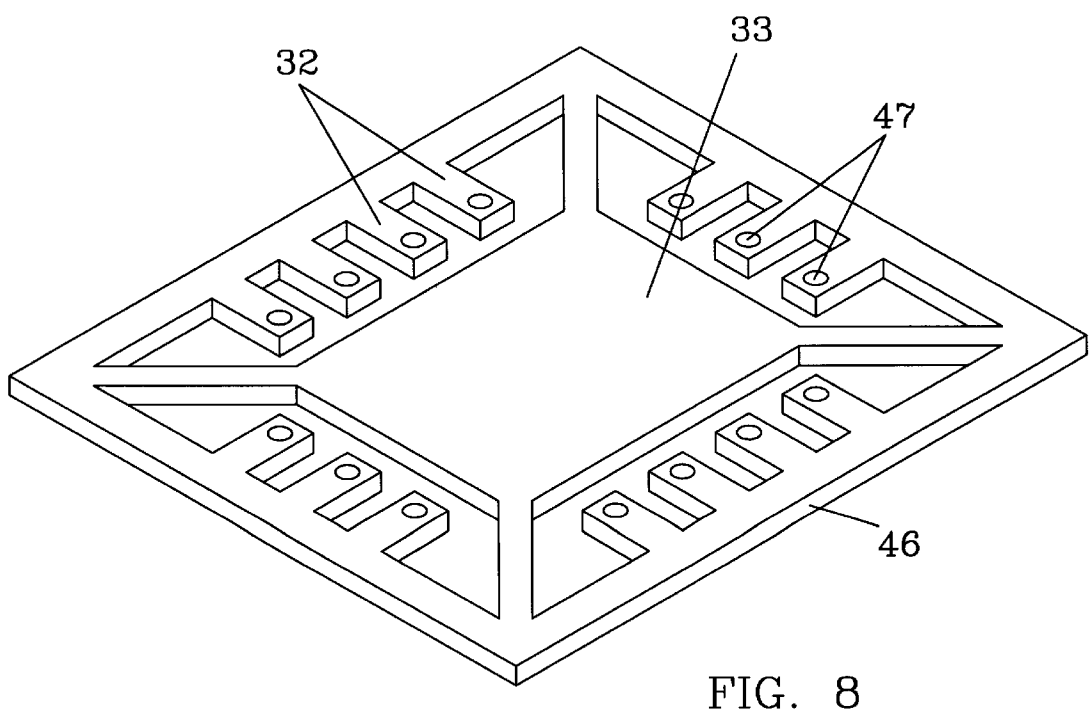
FIG. 8 shows the complete lead frame after spot plating.

The final step in the process is to cut the strip of lead frames into strips of fewer lead frames, or to cut the lead frame strip into single lead frames as depicted in step (23). FIG. 8 illustrates a completed single lead frame 46 with plated spots 47.

Figure 9:
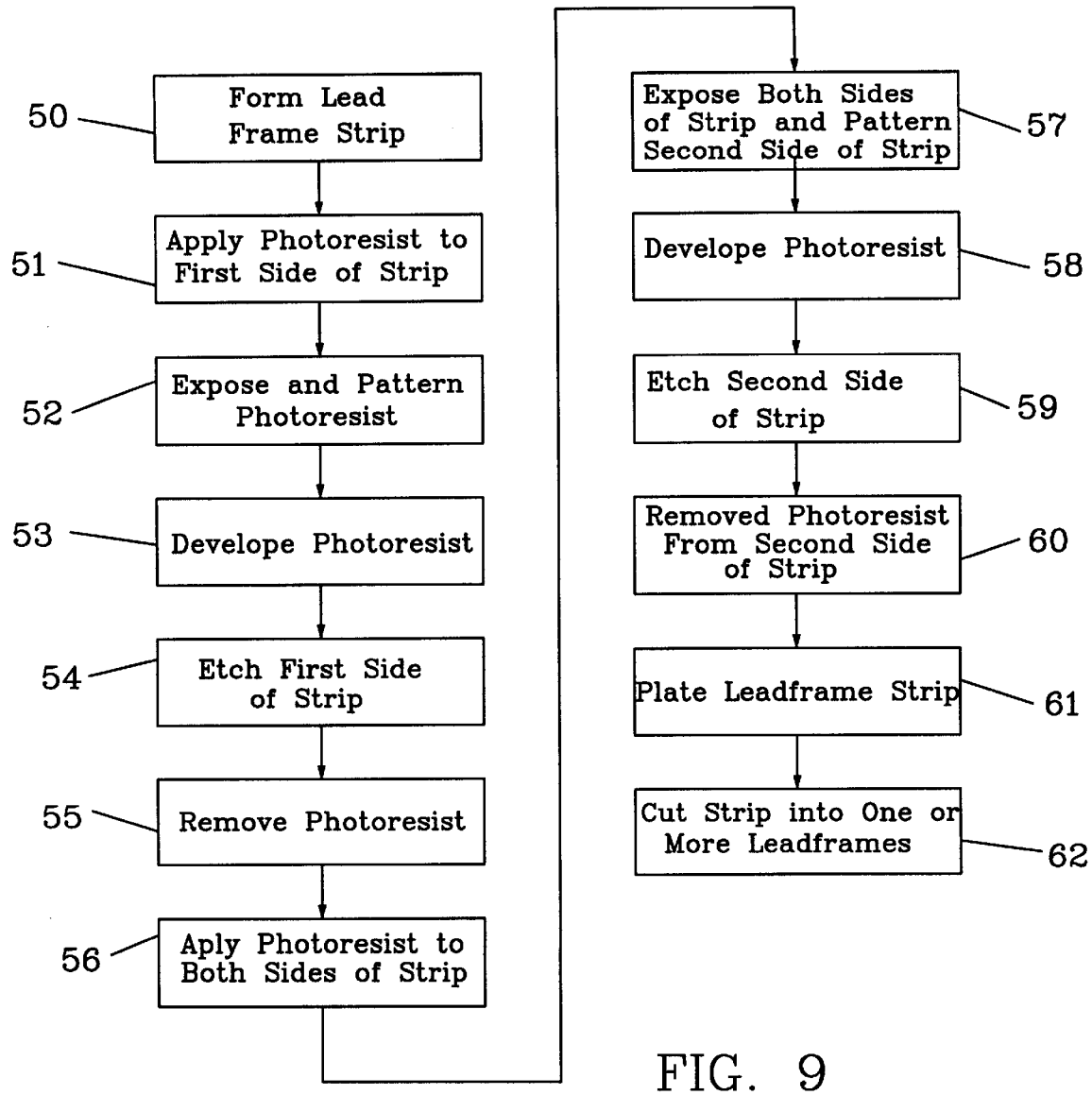
FIG. 9 shows a process flow diagram of a second embodiment of the invention.
Figure 10:
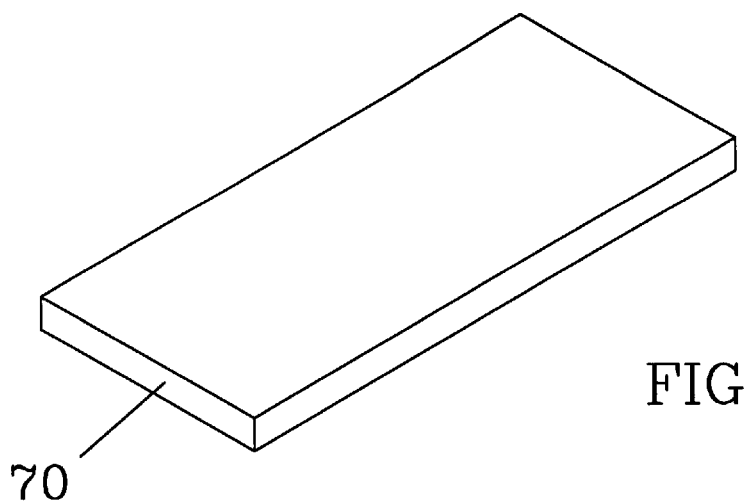
FIG. 10 shows the starting lead frame material on a second embodiment.
Figure 11:
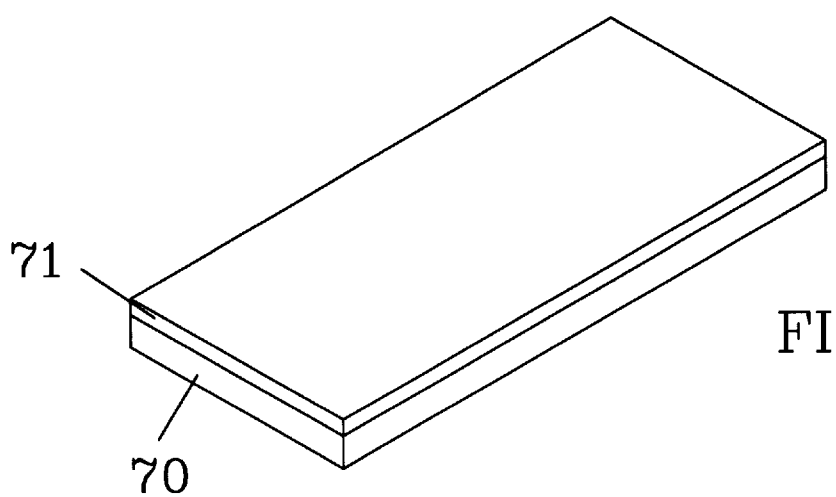
FIG. 11 shows a layer of photoresist on one side of the starting material.

FIG. 9 is a process flow diagram of a second embodiment of the invention in which a semiconductor lead frame is formed with fine pitched leads, and maintaining the leads in a stable condition through out the entire process of making the lead frame. A suitable thin strip of material 70 for making the lead frame is prepare (50). The thin strip is shown in FIG. 10. Lead frames are usually made in continuous strips, but in FIG. 10 a strip 70 is illustrated for a single lead frame. Next a coating 71 of photoresist material 71 is applied to a first side of the lead frame material 70 (51). The lead frame material 70 and photoresist coating 71 is shown in FIG. 11.

The photoresist coating 71 is then expose to a light through a mask to form the lead frame pattern (52). The photoresist coating 71 is then developed (53) to remove the photoresist from areas of the lead frame material 70 that is to be etched in forming the lead frame. The expose areas are etched (54) to etch partially through the lead frame material 70. At this point in the process, the resultant partially etch lead frame is the same as that illustrated in FIG. 4, the lead frame material 70 has been etch approximately half way though, but the depth is not critical since there will be additional etching to remove additional lead frame material. The remaining photoresist 71 is removed (55) from lead frame strip 70.

Figure 12:
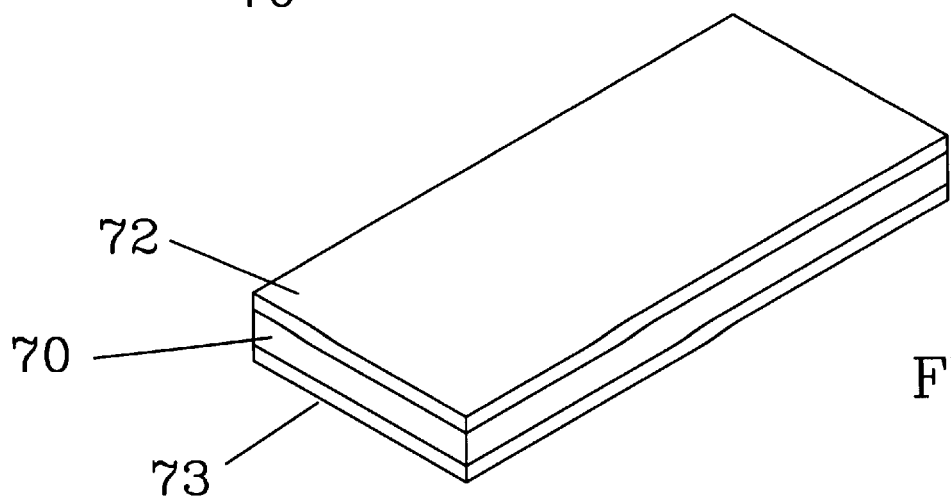
FIG. 12 shows both sides with a layer of photoresist.

After removing the patterned photoresist layer 71, two layers 72 and 73 are applied (56) to each side of material 70. A layer of photoresist 72 is reapplied to the first side of lead frame material 70, and a layer 73 of photoresist material is applied to the side of material 70 opposite from layer 72. The two layers of photoresist 72 and 73 are shown in FIG. 12.

Figure 13:
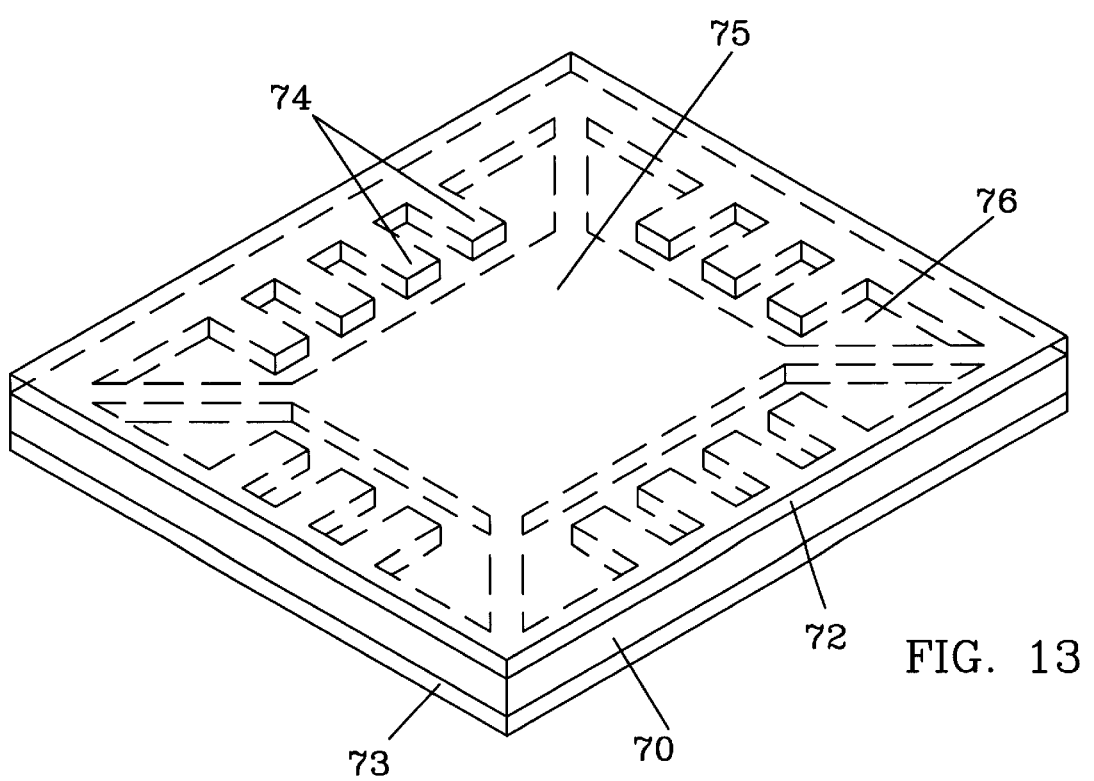
FIG. 13 a partially etched and coated lead frame.

Both sides of photoresist 72 and 73 are exposed, but only one side, side 73, is patterned (57). Both sides 72 and 73 are developed (58). FIG. 13 shows the lead frame material 70 with the covered etched side (with photoresist coating 72) and the layer of patterned photoresist 73. The side of lead frame 70 with patterned photoresist 73 is then etched (59) to complete remove the remaining portions of unwanted material of lead frame 70 to form the lead frame, including the leads and die pad.

After the etch process (59) is completed, then the photoresist 73 is removed (61), but the photoresist coating 72 is not removed. The lead frame on the side that photoresist 73 was removed is then plated (61). The entire surface may be plated, or spot plating may be done on the lead frame leads. The lead frame strip is cut in to a plurality of lead frames, or a single lead frame as illustrated at step (62) in the drawings.

What is claimed:

1. A method of making a lead frame with fine pitch leads, comprising the steps of:
    applying a photoresist layer to a first side of a lead frame material;
    developing the photoresist layer applied to the first side of the lead frame material to define a lead frame pattern;
    etching partially through the first side of the lead frame material to provide a partially etched first side of the lead frame material;
    removing the patterned photoresist from the first side of the lead frame material;
    applying a coating material solely over said partially etched first side of the lead frame material such that the coating material does not fill etched areas within the lead frame material;
    applying a photoresist layer to a second side of the lead frame material;
    developing the photoresist layer applied to the second side of the lead frame material using the lead frame pattern developed in association with the first side of the lead frame material;
    etching the second side of the lead frame material to completely etch through to the partially etched first side to form a lead frame;
    removing patterned photoresist layer from the second side of the lead frame; and plating the lead frame.

2. The method according to claim 1, wherein in the step of applying a coating material over said partially etched first side of the lead frame material, a tape strip is applied over the etched first side.

3. The method according to claim 1, wherein the plating to the lead frame is a spot plating at points on the lead frame to which bond wires are to be attached.

4. The method according to claim 1, wherein in the step of applying a coating material over said partially etched first side of the lead frame material, a layer of developed photoresist is applied over the face of the etched first side.

5. The method according to claim 1, including the step of cutting a strip of lead frames into individual lead frames.

6. A method of making a lead frame with fine pitch leads, comprising the steps of:
    applying a photoresist layer to a first side of a lead frame material;
    developing the photoresist layer applied to the first side of the lead frame material to define a lead frame pattern;
    etching partially through the first side of the lead frame material to provide a partially etched first side of the lead frame material;
    removing the patterned photoresist from the first side of the lead frame material;
    applying a coating of photoresist material solely over said partially etched first side of the lead frame material such that the coating of photoresist material does not fill etched areas within the lead frame material;
    applying a photoresist layer to a second side of the lead frame material;
    developing the photoresist layer applied to the second side of the lead frame material using the lead frame pattern developed in association with the first side of the lead frame material;
    etching the second side of the lead frame material to completely etch through to the partially etched first side to form a lead frame;
    removing the patterned photoresist layer from the second side of the lead frame; and
    plating the lead frame.

7. The method according to claim 6, wherein the plating to the lead frame is a spot plating at points on the lead frame to which bond wires are to be attached.

8. A method of forming a lead frame, comprising the steps of:

partially etching through a first side of a strip of lead frame material;

applying a removable coating material solely over the partially etched first side such that the coating material does not fill etched areas within the lead frame material;

etching a second side of the lead frame material to completely etch through the lead frame material to the partially etched first side and thereby form a lead frame defined by a lead frame pattern common to both the first side of the lead frame material and the second side of the lead frame material; and plating at least a part of said second side of lead frame material.

* * * * *